United States Patent
Oh et al.

(10) Patent No.: US 11,043,516 B2
(45) Date of Patent: Jun. 22, 2021

(54) SENSING DRIVING CIRCUIT HAVING IMPROVED PERFORMANCE AND SENSING, DISPLAY PANEL, AND DISPLAY DEVICE

(71) Applicant: LG DISPLAY CO., LTD., Seoul (KR)

(72) Inventors: KumMi Oh, Seoul (KR); Minseong Yun, Gyeonggi-do (KR); JaeHoon Park, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/542,773

(22) Filed: Aug. 16, 2019

(65) Prior Publication Data

US 2020/0119061 A1    Apr. 16, 2020

(30) Foreign Application Priority Data

Oct. 11, 2018  (KR) .......................... 10-2018-0120915

(51) Int. Cl.
| | |
|---|---|
| *H01L 27/144* | (2006.01) |
| *H01L 27/32* | (2006.01) |
| *G09G 3/3258* | (2016.01) |
| *G06K 9/00* | (2006.01) |

(52) U.S. Cl.
CPC ....... *H01L 27/1443* (2013.01); *G09G 3/3258* (2013.01); *H01L 27/3227* (2013.01); *G06K 9/0004* (2013.01); *G09G 2360/144* (2013.01); *H01L 27/3262* (2013.01)

(58) Field of Classification Search
CPC ......... G06K 9/0004; G09G 2300/0417; G09G 2320/045; G09G 2354/00; G09G 2360/144; G09G 2360/148; G09G 3/3258; H01L 27/1443; H01L 27/3227; H01L 27/3234; H01L 27/3262
See application file for complete search history.

(56) References Cited

U.S. PATENT DOCUMENTS

| | | | |
|---|---|---|---|
| 2015/0243685 A1* | 8/2015 | Lee .................... | H01L 29/78675 257/43 |
| 2016/0027853 A1* | 1/2016 | Ahn ...................... | H01L 27/127 257/40 |
| 2020/0013843 A1* | 1/2020 | Choi ................... | H01L 27/3276 |

* cited by examiner

*Primary Examiner* — Chun-Nan Lin
(74) *Attorney, Agent, or Firm* — Birch, Stewart, Kolasch & Birch, LLP

(57) ABSTRACT

A display device can include a display panel including a plurality of gate lines, a plurality of data lines and a plurality of subpixels; at least one display driving transistor disposed in each of the plurality of subpixels; a sensing transistor disposed in each of the plurality of subpixels; a driver circuit configured to control the sensing transistor; and a sensing circuit electrically connected to a first electrode of the sensing transistor, in which a gate electrode of the at least one display driving transistor and a gate electrode of the sensing transistor are disposed on opposite sides of an active layer in a top-down direction.

12 Claims, 10 Drawing Sheets

Sensing – Bottom gate TFT | Display Driving – Top gate TFT ( Vcon = Low, Vsen = Vref )

( Vcon = High, Vsen < Vref )

SENSING DRIVING CIRCUIT HAVING IMPROVED PERFORMANCE AND SENSING, DISPLAY PANEL, AND DISPLAY DEVICE

CROSS REFERENCE TO RELATED APPLICATION

This application claims priority to Korean Patent Application No. 10-2018-0120915, filed in the Republic of Korea on Oct. 11, 2018, which is hereby incorporated by reference for all purposes as if fully set forth herein.

BACKGROUND

Field

Example embodiments relate to a sensing driving circuit, a display panel, and a display device.

Description of Related Art

In response to the development of the information society, demand for image display devices is increasing. In this regard, a range of display devices, such as liquid crystal display (LCD) devices, and organic light-emitting diode (OLED) display devices, have recently come into widespread use.

Such a display device uses a photosensor to provide a greater variety of functions, such as luminous intensity sensing and fingerprint sensing, to users. The photosensor is disposed within a display to sense light radiated from an external source or reflected from an object adjacent to the display.

The photosensor may generally be disposed in the bezel of the display panel. Accordingly, such provision of a photosensor may cause a difficulty in reducing the bezel area. In addition, there is demand for a solution enabling a display device having a narrow bezel to provide an optical sensing function.

BRIEF SUMMARY

Various aspects of the present disclosure provide a display panel and a display device having a subpixel structure able to provide an optical sensing function in an active area of the display panel.

Also provided are a display panel and a display device able to protect display driving elements disposed in a subpixel from any effect caused by light entering the display panel and improving the sensing performance of an optical sensing element.

Also provided are a sensing driving circuit able to perform optical sensing using an optical sensing element disposed in a subpixel while minimizing an effect on the display driving of the subpixel, and a display panel and display device including the same.

According to an aspect, example embodiments can provide a display device including: a display panel in which a plurality of gate lines, a plurality of data line, and a plurality of subpixels are disposed; at least one display driving transistor disposed in each of the plurality of subpixels; a sensing transistor disposed in each of the plurality of subpixels; a driver circuit controlling the sensing transistor; and a sensing circuit electrically connected to a first electrode of the sensing transistor.

In the display device, a gate electrode of the display driving transistors and a gate electrode of the sensing transistor can be disposed on opposite sides of an active layer in a top-down direction.

According to another aspect, example embodiments can provide a display panel including: a substrate; a first gate electrode located on the substrate; a first channel area located on the first gate electrode; a second channel area disposed on the same layer as the first channel area; and a second gate electrode located on the second channel area. The first channel area is disposed between the first gate electrode and a surface through which external light enters.

According to another aspect, example embodiments can provide a sensing driving circuit including: a control signal output portion outputting a turn-on signal to a gate electrode of a sensing transistor disposed in a subpixel in a display driving period, and outputting a turn-off signal to the gate electrode of the sensing transistor disposed in the subpixel in a sensing period; and a sensing portion supplying a first electrode of the sensing transistor with a voltage having the same level as a voltage applied to a second electrode of the sensing transistor in the display driving period and supplying the first electrode of the sensing transistor with a voltage having a lower or higher voltage level than a voltage applied to the second electrode of the sensing transistor in the sensing period.

According to embodiments, a sensing transistor generating an off-current in response to light may be disposed in subpixels arrayed in a display panel, such that an optical sensing function can be provided in an active area of the display panel.

In addition, according to embodiments, the gate electrode of a display driving transistor may be disposed between an active layer and a light incident surface, thereby blocking light entering the display panel from arriving at the active layer of the driving transistor.

In addition, according to embodiments, the gate electrode of the sensing transistor may be disposed opposite to the light incident surface in order to improve optical sensing performance by enhancing the photo-responsiveness of the active layer of the sensing transistor.

In addition, according to embodiments, optical sensing can be performed by detecting an off-current in the sensing transistor in a sensing period, and the sensing transistor may be turned on and a voltage having the same level may be applied to the source electrode and the drain electrode of the sensing transistor in a display driving period, such that the sensing transistor disposed in the subpixel can perform optical sensing without affecting the display driving operation.

BRIEF DESCRIPTION OF THE DRAWINGS

The above and other objects, features, and advantages of the present disclosure will be more clearly understood from the following detailed description when taken in conjunction with the accompanying drawings, in which.

DETAILED DESCRIPTION OF THE EMBODIMENTS

Figure 1:
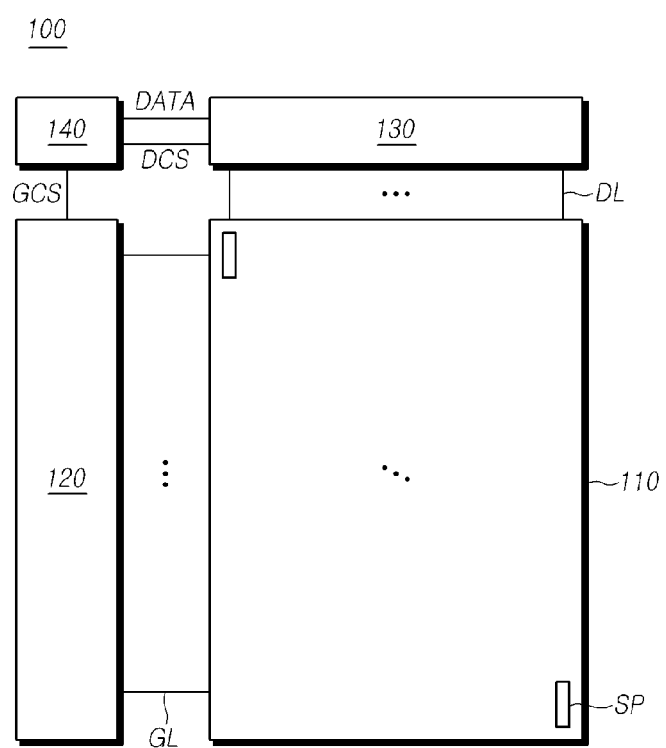
FIG. 1 illustrates a schematic configuration of a display device according to embodiments.

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated into the present disclosure will be omitted in the situation that the subject matter of the present disclosure may be rendered unclear thereby.

It will also be understood that, while terms, such as "first," "second," "A," "B," "(a)," and "(b)," may be used herein to describe various elements, such terms are merely used to distinguish one element from other elements. The substance, sequence, order, or number of such elements is not limited by these terms. It will be understood that when an element is referred to as being "connected," "coupled," or "linked" to another element, not only can it be "directly connected, coupled, or linked" to the other element, but it can also be "indirectly connected, coupled, or linked" to the other element via an "intervening" element.

FIG. 1 illustrates a schematic configuration of a display device 100 according to embodiments.

Referring to FIG. 1, the display device 100 according to embodiments can include a display panel 110 in which a plurality of subpixels SP respectively including a light-emitting element are arrayed, as well as components for driving the display panel 110, such as a gate driver circuit 120, a data driver circuit 130, and a controller 140.

In the display panel 110, a plurality of gate lines GL and a plurality of data lines DL are disposed, and a plurality of subpixels SP are disposed in areas in which the plurality of gate lines GL intersect the plurality of data lines DL. Each of the plurality of subpixels SP can include a light-emitting element, and two or more subpixels SP can form a single pixel.

The gate driver circuit 120 is controlled by the controller 140 to sequentially output a scanning signal to the plurality of gate lines GL, disposed in the display panel 110, thereby controlling points in time at which the plurality of subpixels SP are driven. In addition, the gate driver circuit 120 can output an emission signal to control emission times of the light-emitting elements in the subpixels SP. The circuit outputting the scanning signal and the circuit outputting the emission signal can be provided integrally or separately.

The gate driver circuit 120 can include one or more gate driver integrated circuits (ICs). The gate driver circuit 120 can be disposed on one side or both sides of the display panel 110, depending on the driving system.

The data driver circuit 130 receives image data from the controller 140 and converts the image data into an analog data voltage. In addition, the data driver circuit 130 outputs the data voltage to the data lines DL, respectively, at points in time at which the scanning signal is applied through the gate lines GL, so that the subpixels SP represent brightness levels corresponding to the image data.

The data driver circuit 130 can include one or more source driver ICs.

The controller 140 supplies a variety of control signals to the gate driver circuit 120 and the data driver circuit 130 to control the operations of the gate driver circuit 120 and the data driver circuit 130.

The controller 140 controls the gate driver circuit 120 to output the scanning signal at points in time defined by frames. The controller 140 converts image data, received from an external source, into a data signal format readable by the data driver circuit 130, and outputs the converted image data to the data driver circuit 130.

The controller 140 receives a variety of timing signals, including a vertical synchronization signal Vsync, a horizontal synchronization signal Hsync, an input data enable (DE) signal, a clock (CLK) signal, and the like, in addition to the image data, from an external source (e.g., a host system).

The controller 140 can generate a variety of control signals using the variety of timing signals received from the external source and output the control signals to the gate driver circuit 120 and the data driver circuit 130.

For example, the controller 140 outputs a variety of gate control signals GCS, including a gate start pulse (GSP) signal, a gate shift clock (GSC) signal, a gate output enable (GOE) signal, and the like, to control the gate driver circuit 120.

Here, the gate start pulse signal controls the operation start time of the one or more gate driver ICs of the gate driver circuit 120. The gate shift clock is a clock signal commonly input to the one or more gate driver ICs to control the shift time of the scanning signal. The gate output enable signal designates timing information of the one or more gate driver ICs.

In addition, the controller 140 outputs a variety of data control signals DCS, including a source start pulse (SSP) signal, a source sampling clock (SSC), a source output enable (SOE) signal, and the like, to control the data driver circuit 130.

Here, the source start pulse signal controls the data sampling start time of the one or more source driver ICs of the data driver circuit 130. The source sampling clock is a clock signal controlling the sampling time of data in each of the source driver ICs. The source output enable signal controls the output time of the data driver circuit 130.

The display device 100 can further include a power management integrated circuit (PMIC) to supply various forms of voltage or current to the display panel 110, the gate driver circuit 120, the data driver circuit 130, and the like, or control various forms of voltage or current to be supplied to the same.

In addition, signal or voltage lines, through which a variety of signals or voltages are supplied, can be disposed in the display panel 110, in addition to the gate lines GL and the data lines DL. Each of the subpixels SP can accommodate a light-emitting element, transistors driving the light-emitting element, and the like.

Figure 2:
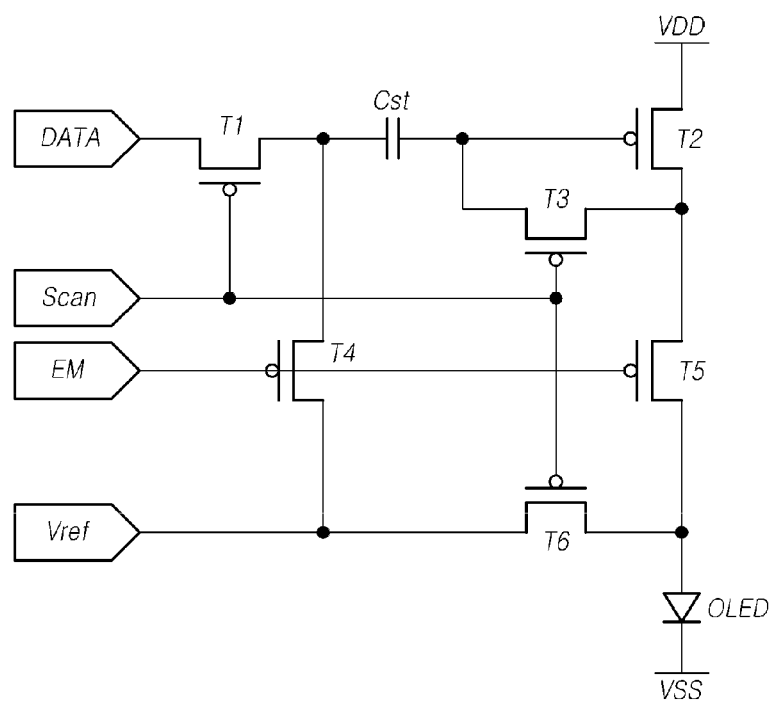
FIG. 2 illustrates a circuit diagram of the subpixel arrayed in the display panel of the display device according to embodiments.

FIG. 2 illustrates a circuit diagram of the subpixel SP arrayed in the display panel 110 of the display device 100 according to embodiments. A situation in which the display device 100 according to embodiments is an organic light-emitting display device is taken by way of example.

Referring to FIG. 2, in each of the subpixels SP arrayed in the display panel 110, an organic light-emitting diode OLED, a plurality of display driving transistors driving the organic light-emitting diode OLED, and a capacitor Cst can be disposed.

FIG. 2 illustrates a 6T1C structure in which six (6) display driving transistors T1, T2, T3, T4, T5, and T6 and one (1) capacitor Cst are disposed in the subpixel SP. The subpixel SP can have a variety of other structures, depending on the number or connection structure of circuit elements disposed therein.

In addition, although the display driving transistors, disposed in the subpixel SP, are illustrated as being p-type transistors, n-type display driving transistors can be disposed in the subpixel SP.

The first transistor T1 can be electrically connected between the data driver circuit 130 and the capacitor Cst, and can be controlled by a scanning signal supplied through a gate line GL.

In response to a scanning signal having a turn-on level being applied to the first transistor T1 through the gate line GL, the first transistor T1 allows the data voltage, supplied by the data driver circuit 130, to be applied to one portion of the capacitor Cst.

The second transistor T2 can be electrically connected between a line, through which a driving voltage VDD is supplied, and the fifth transistor T5. The gate electrode of the second transistor T2 can be electrically connected to the capacitor Cst.

The second transistor T2 is also referred to as a driving transistor. The second transistor T2 can control the level of brightness represented by the organic light-emitting diode OLED by controlling a current flowing through the organic light-emitting diode OLED, in response to a voltage applied to the gate electrode.

The third transistor T3 can be electrically connected between the gate electrode and the drain electrode or the gate electrode and the source electrode of the second transistor T2. In addition, the third transistor T3 can be controlled by the scanning signal supplied through the gate line GL.

The third transistor T3 is intended to compensate for the threshold voltage of the second transistor T2, and can also be referred to as a compensation transistor.

That is, the second transistor T2 is a driving transistor to control the current flowing through the organic light-emitting diode OLED in response to the data voltage applied to the subpixel SP. However, the organic light-emitting diode OLED disposed in each of the subpixels SP may not represent an intended level of brightness, due to a variation in the threshold voltage of the second transistor T2 disposed in each of the subpixels SP.

In this regard, the threshold voltage of the second transistor T2, disposed in each of the subpixels SP, is compensated for using the third transistor T3.

For example, when a scanning signal for turning the third transistor T3 on is applied through the gate line GL, a voltage, produced by deducting the threshold voltage of the second transistor T2 from the driving voltage VDD, is applied to the gate electrode of the second transistor T2.

In a state in which the driving voltage VDD, from which the threshold voltage is deducted, is applied to the gate electrode of the second transistor T2, compensation for the threshold voltage of the second transistor T2 can be performed by applying the data voltage to one portion of the capacitor Cst.

Here, the first transistor T1, controlling the application of the data voltage to one portion of the capacitor Cst, and the third transistor T3, performing compensation for the threshold voltage of the second transistor T2, can be controlled by the scanning signal supplied through the same gate line GL or the scanning signal supplied through different gate lines GL.

As described above, as the variation of the threshold voltage of the second transistor T2 is compensated for using the third transistor T3, the variation of the luminance of the subpixel SP, caused by the different threshold voltage of the second transistor 12, can be prevented.

The fourth transistor T4 can be electrically connected between the capacitor Cst and a line, through which a reference voltage Vref is supplied. In addition, the fourth transistor T4 can be controlled by an emission signal supplied through the gate line GL.

When the emission signal having a turn-on level is applied through the gate line GL, the fourth transistor T4 can initialize the voltage of one portion of the capacitor Cst, or can allow a current resulting from the data voltage, applied to one portion of the capacitor Cst, to flow through the organic light-emitting diode OLED while gradually discharging the data voltage.

The fifth transistor T5 is electrically connected between the second transistor T2 and the organic light-emitting diode OLED. The fifth transistor T5 can be controlled by the emission signal supplied through the gate line GL.

In a state in which the data voltage is applied to one portion of the capacitor Cst, and the driving voltage VDD, compensated for the threshold voltage, is applied to the gate node of the second transistor T2, the fifth transistor T5 can be turned on by an application of the emission signal having a turn-on level, thereby allowing the current to flow through the organic light-emitting diode OLED.

The fourth transistor T4 and the fifth transistor T5 are also referred to as emission transistors, since they control points in time at which the organic light-emitting diode OLED emits light.

The sixth transistor T6 can be electrically connected between a line, through which the reference voltage Vref is supplied, and the anode of the organic light-emitting diode OLED. The sixth transistor T6 can be controlled by the scanning signal supplied through the gate line GL.

When the scanning signal having a turn-on level is supplied through the gate line GL, the sixth transistor T6 can initialize the anode of the organic light-emitting diode OLED or the node between the second transistor T2 and the fifth transistor T5 using the reference voltage Vref.

The display driving transistors, disposed in the subpixel SP as described above, are operated by the scanning signal and the emission signal, and allow the current, resulting from the data voltage, to flow through the organic light-emitting diode OLED, so that the subpixel SP can represent levels of brightness depending on the image data.

According to embodiments, a light responsive transistor is disposed in the subpixel SP to provide a light sensing function in an active area of the display panel 110.

In addition, the light responsive transistor is disposed so as not to affect the operation of any of the display driving transistors, such that the subpixel SP can perform optical sensing, as well as normal display driving.

Hereinafter, descriptions will mainly be focused on a situation in which the optical sensing transistor is used in the subpixel SP having the above-described 6T1C structure, the optical sensing transistor can be used in a similar manner in the subpixels SP having different structures.

Figure 3:
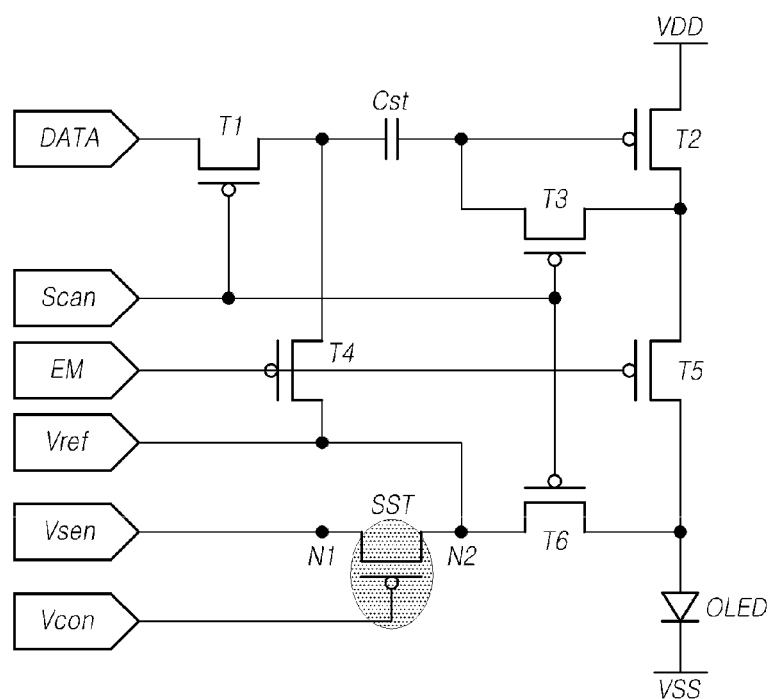
FIG. 3 illustrates a circuit structure of the subpixel SP in the display panel according to embodiments, in which a sensing transistor SST is disposed.

FIG. 3 illustrates a circuit structure of the subpixel SP in the display panel 110 according to embodiments, in which a sensing transistor SST is disposed.

Referring to FIG. 3, in the subpixel SP arrayed in the display panel 110, the organic light-emitting diode OLED, the plurality of display driving transistors T1, T2, T3, T4, T5, and T6 driving the organic light-emitting diode OLED, and the capacitor Cst can be disposed.

In addition, the sensing transistor SST for sensing light can be disposed in at least one subpixel SP among the plurality of subpixels SP arrayed in the display panel 110.

The sensing transistor SST can be electrically connected, for example, between a line, through which the reference voltage Vref is supplied to the subpixel SP, and a line, through which a sensing voltage Vsen is supplied to the subpixel SP. In addition, the gate electrode of the sensing transistor SST can be electrically connected to a line, through which a control voltage Vcon or a control signal is applied.

That is, a source electrode or a drain electrode of the sensing transistor SST can have the sensing voltage Vsen applied thereto. In addition, the source electrode or the drain electrode of the sensing transistor SST can have the reference voltage Vref applied thereto.

The source electrode or drain electrode of the sensing transistor SST can be electrically connected to the source electrode or the drain electrode of at least one display driving transistor among the display driving transistors disposed in the subpixel SP.

For example, as illustrated in FIG. 3, the source electrode or the drain electrode of the sensing transistor SST can be electrically connected to the source electrode or the drain electrode of the sixth transistor T6, e.g., one of the display driving transistors. In addition, the source electrode or the drain electrode of the sensing transistor SST can also be regarded as being electrically connected to the source electrode or the drain electrode of the fourth transistor T4.

That is, the source electrode, the drain electrode, and an active layer of the sensing transistor SST can be disposed on the same layer on which the source electrodes, the drain electrodes, and the active layers of the display driving transistors are disposed, so that the sensing transistor SST can be disposed in the process of disposing the display driving transistors, without additional processing.

The sensing transistor SST can be turned on by the control voltage Vcon applied to the gate electrode.

For example, the control voltage Vcon having a turn-on level can be applied to the gate electrode of the sensing transistor SST.

In addition, a voltage (e.g., a sensing voltage) having the same level as a voltage applied to the second node N2 of the sensing transistor SST can be applied to the first node N1 of the sensing transistor SST.

That is, during a display driving period, the sensing voltage Vsen having the same level as the reference voltage Vref can be applied to the first node N1 of the sensing transistor SST.

Since, in the display driving period, the sensing transistor SST is in a turned-on state, and the first node N1 and the second node N2 of the sensing transistor SST have the same voltage levels, the sensing transistor SST does not affect the operation of any of the display driving transistors in the display driving period. In other words, the sensing transistor SST can act like a regular wire during the display driving period.

Accordingly, the display driving transistors disposed in the subpixel SP can operate normally, even in the situation that the sensing transistor SST is additionally disposed in the subpixel SP.

The control voltage Vcon having a turn-off level can be applied to the gate electrode of the sensing transistor SST during a sensing period.

In addition, a voltage, having a lower or higher voltage level than the voltage applied to the second node N2 of the sensing transistor SST, can be applied to the first node N1 of the sensing transistor SST.

That is, the sensing voltage Vsen having a lower or higher voltage level than the reference voltage Vref can be applied to the first node N1 of the sensing transistor SST.

Consequently, the voltage level of the second node N2 of the sensing transistor SST, in the turned-off state, is higher than the voltage level of the first node N1 of the sensing transistor SST (e.g., voltage of N2>voltage of N1, in the turned-off state).

At this time, when the subpixel SP is irradiated with light, the sensing transistor SST can react with light, thereby generating an off current. In addition, since the voltage level of the second node N2 of the sensing transistor SST is higher than the voltage level of the first node N1 of the sensing transistor SST, a change in the current of the first node N1 of the sensing transistor SST is caused.

During the sensing period, the change in the current of the current flowing through the line connected to the first node N1 of the sensing transistor SST can be detected, so that the optical sensing can be performed.

The optical sensing can be to sense a level of luminance outside of the display panel 110 or to sense a beam of a laser pointer on the display panel 110.

Alternatively, the optical sensing can sense the fingerprint of a finger touching the display panel 110. For example, the fingerprint touching the display panel 110 can be sensed by analyzing currents detected from the subpixels SP disposed in locations corresponding to ridges and valleys of the fingerprint.

That is, the optical sensing can include both sensing light incident on the display panel 110 and sensing incident light reflected from an object adjacent to the display panel 110.

As described above, according to embodiments, the sensing transistor SST can be disposed so as not to affect the operation of any of the display driving transistors, such that the optical sensing can be performed in the active area of the display panel 110.

In addition, the source electrode, drain electrode, the active layer, and the like of the sensing transistor SST can be disposed on the same layer as the source electrodes, drain electrodes, the active layers, and the like of the display driving transistors, such that the sensing transistor SST can be disposed without additional processing.

The gate electrode of the sensing transistor SST can be located opposite to the gate electrodes of the display driving transistors with respect to the active layer in order to prevent the malfunctioning of the display driving transistors and improve the performance of the optical sensing of the sensing transistor SST.

Figure 4:
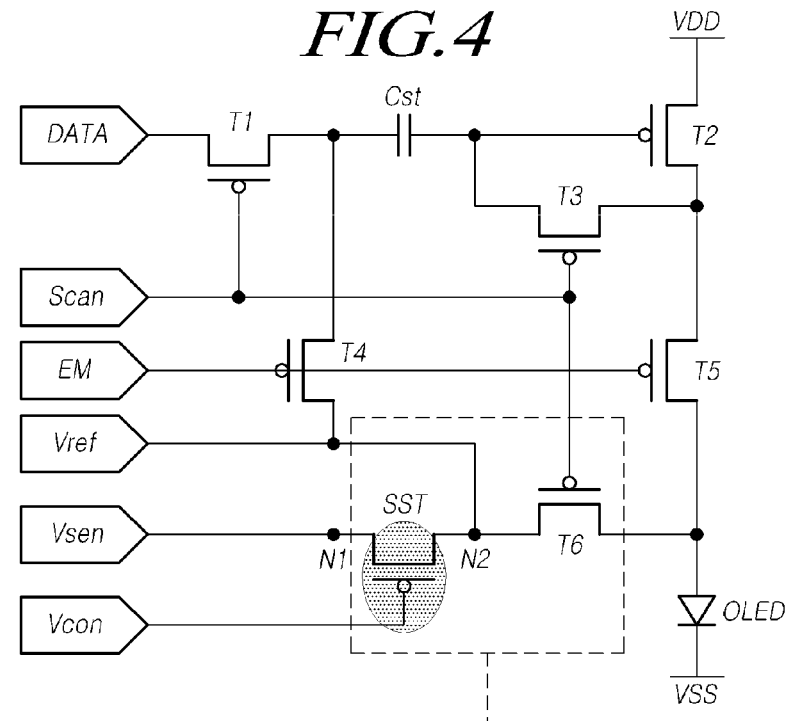
FIG. 4 illustrates a structure of the subpixel illustrated in FIG. 3, in which the gate electrode of the sensing transistor and the gate electrode of the display driving transistor are disposed according to an embodiment.
Figure 4:
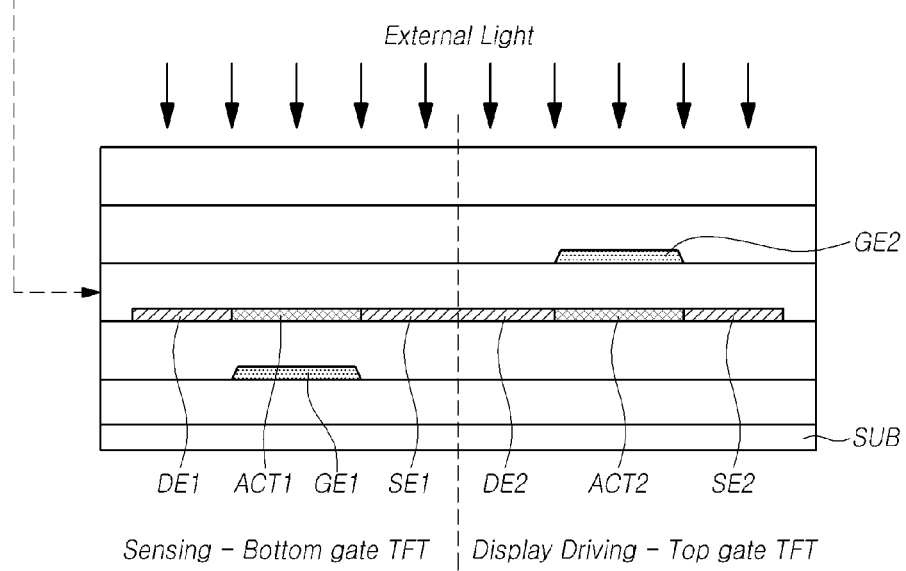

FIG. 4 illustrates a structure of the subpixel SP illustrated in FIG. 3, in which the gate electrode of the sensing transistor SST and the gate electrode of the display driving transistor are disposed.

Specifically, FIG. 4 illustrates the cross-sectional structure of the sensing transistor SST and the sixth transistor T6, e.g., one of the display driving transistors, disposed in the subpixel SP, focused on the configuration of the sensing transistor SST and the sixth transistor T6 disposed in the display panel 110.

A first gate electrode GE1 can be located on a substrate SUB, and a first active layer ACT1 can be located on the first gate electrode GE1. The first active layer ACT1 can be referred to as being a first channel area. In addition, a first drain electrode DE1 and a first source electrode SE1 can be disposed to be connected to the first active layer ACT1.

An insulating layer can be disposed between the substrate SUB and the first gate electrode GE1 or between the first gate electrode GE1 and the first active layer ACT1.

The first gate electrode GE1, the first active layer ACT1, the first drain electrode DE1, and the first source electrode SE1 can form the sensing transistor SST.

In addition, a second active layer ACT2 can be disposed in the same layer as the first active layer ACT1. The second active layer ACT2 can be referred to as a second channel area.

A second drain electrode DE2 and a second source electrode SE2 can be disposed to be connected to the second active layer ACT2, and a second gate electrode GE2 can be located on the second active layer ACT2.

An insulating layer can be disposed between the second active layer ACT2 and the second gate electrode GE2. The second gate electrode GE2, the second active layer ACT2, the second drain electrode DE2, and the second source electrode SE2 can form the sixth transistor T6.

As described above, in the sensing transistor SST, the first active layer ACT1 can be disposed between the first gate electrode GE1 and a light incidence surface through which external light enters. In addition, in the sixth transistor T6, e.g., one of the display driving transistors, the second gate electrode GE2 can be disposed between the second active layer ACT2 and the light incidence surface.

That is, in the structure in which external light enters the display panel 110 as illustrated in FIG. 4, the sensing transistor SST can be disposed to have a bottom gate structure, and the display driving transistors, including the sixth transistor T6, can be disposed to have a top gate structure.

The sixth transistor T6, e.g., one of the display driving transistors, can block external incident light from arriving at the second active layer ACT2, due to the second gate electrode GE2 being disposed on the second active layer ACT2.

Accordingly, since the gate electrodes of the display driving transistors are disposed to block light from arriving at the active layer, so that the malfunctioning of the display driving transistors in response to external incident light can be prevented.

In addition, in the sensing transistor SST, the first gate electrode GE1 is disposed below the first active layer ACT1, such that the area of the first active layer ACT1 exposed to external light can be increased.

That is, an increase in the light-receiving area of the first active layer ACT1 of the sensing transistor SST can increase an amount of off-current generated by the external incident light.

Accordingly, the optical sensing performance of the sensing transistor SST, disposed in the subpixel SP, can be improved by enhancing the photo-responsiveness of the sensing transistor SST.

In addition, the first gate electrode GE1, disposed below the first active layer ACT1 of the sensing transistor SST, can be provided using metal disposed in the corresponding layer for the generation of capacitance or metal used as a signal line. Accordingly, the sensing transistor SST providing high optical sensing performance can be disposed in the subpixel SP without additional processing for fabricating the first gate electrode GE1.

In addition, the first active layer ACT1 of the sensing transistor SST can improve the optical sensing performance using surface protrusions produced in the fabrication process.

Figure 5:
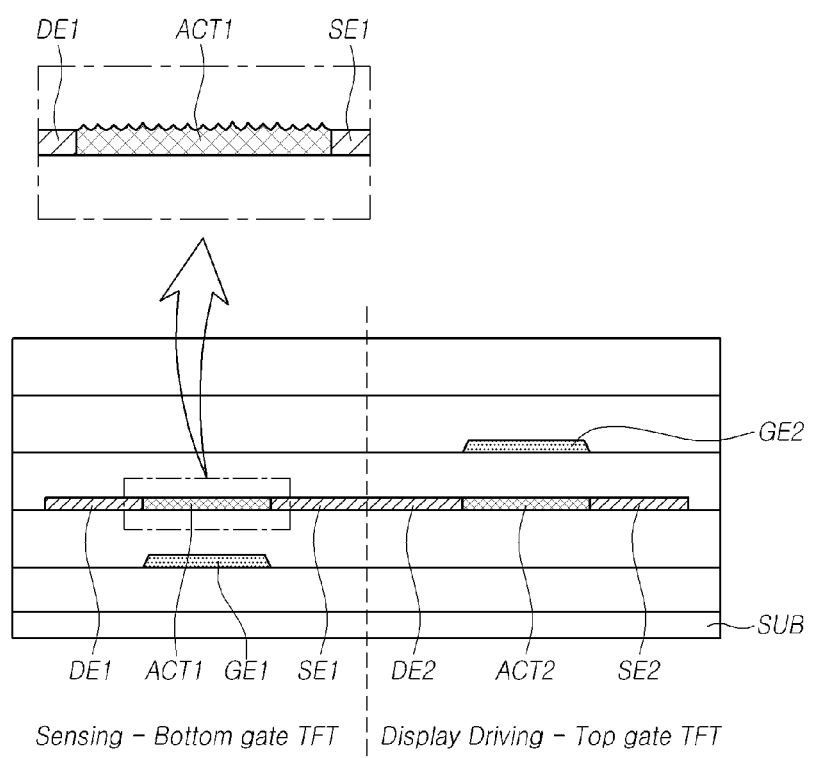
FIG. 5 illustrates a surface structure of the first active layer of the sensing transistor disposed in the subpixel illustrated in FIG. 3 according to an embodiment.

FIG. 5 illustrates a surface structure of the first active layer ACT1 of the sensing transistor SST disposed in the subpixel SP illustrated in FIG. 3.

Referring to FIG. 5, a plurality of protrusions can be provided on one surface of the first active layer ACT1 of the sensing transistor SST, opposite to the first gate electrode GE1.

For example, the first active layer ACT1 can be polycrystalline silicon. The first active layer ACT1, made of low-temperature polycrystalline silicon, can have low series resistance, and can allow an insulating layer between the first active layer ACT1 and the first gate electrode GE1 to be thin.

The plurality of protrusions can be fabricated on the surface of the first active layer ACT1, made of low-temperature polycrystalline silicon, during the fabrication process.

Specifically, low-temperature polycrystalline silicon can be fabricated by depositing amorphous silicon on the substrate SUB or an insulating film by plasma chemical vapor deposition or the like, and then recrystallizing the amorphous silicon by irradiating the amorphous silicon with excimer laser beams.

During the recrystallization, the plurality of protrusions can be formed on the surface of the first active layer ACT1, as illustrated in FIG. 5.

Since the plurality of protrusions are formed on the light incident surface of the first active layer ACT1 of the sensing transistor SST, the light-receiving area of the first active layer ACT1 can be increased (e.g., the surface area can be increased due to the roughness or textured surface of the first active layer ACT1).

That is, according to embodiments, the light-receiving area of the first active layer ACT1 can be increased, due to the sensing transistor SST disposed to have a bottom gate structure.

In addition, since light is incident on the surface of the first active layer ACT1, having the plurality of protrusions, the light-receiving area of the first active layer ACT1 can be increased, thereby amplifying the off-current and further improving the optical sensing performance.

The optical sensing using the sensing transistor SST as described above can be performed in a sensing period separated from the display driving period in a time division manner. That is, the sensing period is a different fraction of time from the display driving period.

Figure 6:
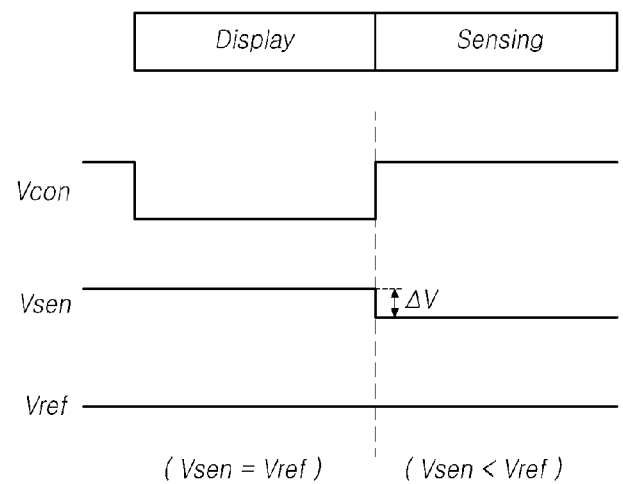
FIG. 6 illustrates points in time at which the display device according to embodiments performs display driving and optical sensing according to an embodiment.

FIG. 6 illustrates points in time at which the display device 100 according to embodiments performs display driving and optical sensing.

Referring to FIG. 6, the display device 100 can perform optical sensing by driving the sensing transistor SST disposed in the subpixel SP during a sensing period separated from the display driving period in a time division manner.

Here, the sensing period can be present in every frame period, or can be present only in a certain frame period. In addition, a horizontal blank period or vertical blank period in a frame period can correspond to the sensing period.

The display device 100 displays an image corresponding to the image data by driving the display driving transistors in the subpixel SP in the display driving period.

Here, the sensing transistor SST can be in a turned-on state during the display driving period, since a control voltage Vcon having a low level is applied to the gate electrode of the sensing transistor SST.

In addition, a sensing voltage Vsen, applied to the first node N1 of the sensing transistor SST, can have the same level as a reference voltage Vref applied to the second node N2 of the sensing transistor SST.

Accordingly, the sensing transistor SST may have no effect on the operation of the display driving transistors disposed in the subpixel SP during the display driving period.

In addition, the sensing transistor SST can be in the turned-off state in the sensing period, since the control voltage Vcon, applied to the sensing transistor SST, has a high level.

In addition, the sensing voltage Vsen, applied to the first node N1 of the sensing transistor SST, can be lower or higher than the reference voltage Vref, applied to the second node N2 of the sensing transistor SST, by $\Delta V$.

Alternatively, in some situations, the reference voltage Vref, applied to the second node N2 of the sensing transistor SST in the sensing period, can be raised above the sensing voltage Vsen.

In a state in which the sensing transistor SST is turned off, a voltage difference can occur between the first node N1 and the second node N2 of the sensing transistor SST.

In addition, since an off-current is generated in response to the sensing transistor SST being exposed to light, a change in current in the line connected to the first node N1 of the sensing transistor SST can be detected.

Due to such detection of a change in the current, it is possible to determine whether or not the subpixel SP, in which the corresponding sensing transistor SST is disposed, is exposed to light and to perform optical sensing.

Figure 7:
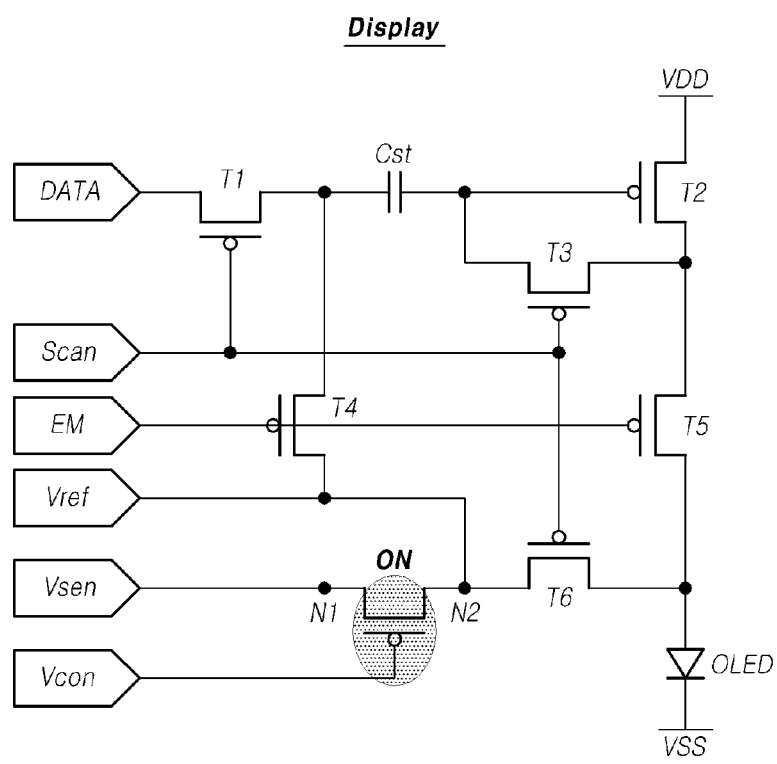
FIG. 7 illustrates a driving mode of the subpixel in the display driving period, at the points in time illustrated in FIG. 6 according to an embodiment.

FIG. 7 illustrates a driving mode of the subpixel SP in the display driving period, at the points in time illustrated in FIG. 6.

Referring to FIG. 7, a control voltage Vcon having a low level is applied to the gate electrode of the sensing transistor SST, disposed in the subpixel SP, in the display driving period, so that the sensing transistor SST is in a turned-on state during the display driving period.

In addition, a voltage having the same level is applied to the first node N1 and the second node N2 of the sensing transistor SST, so that the sensing transistor SST, disposed in the subpixel SP, has no effect on the operation of the other display driving transistors.

Accordingly, in the display driving period, it is possible to ensure the display driving of the subpixel is performed normally by turning the sensing transistor SST on and preventing the voltage of the node connected to the sensing transistor SST from changing.

Figure 8:
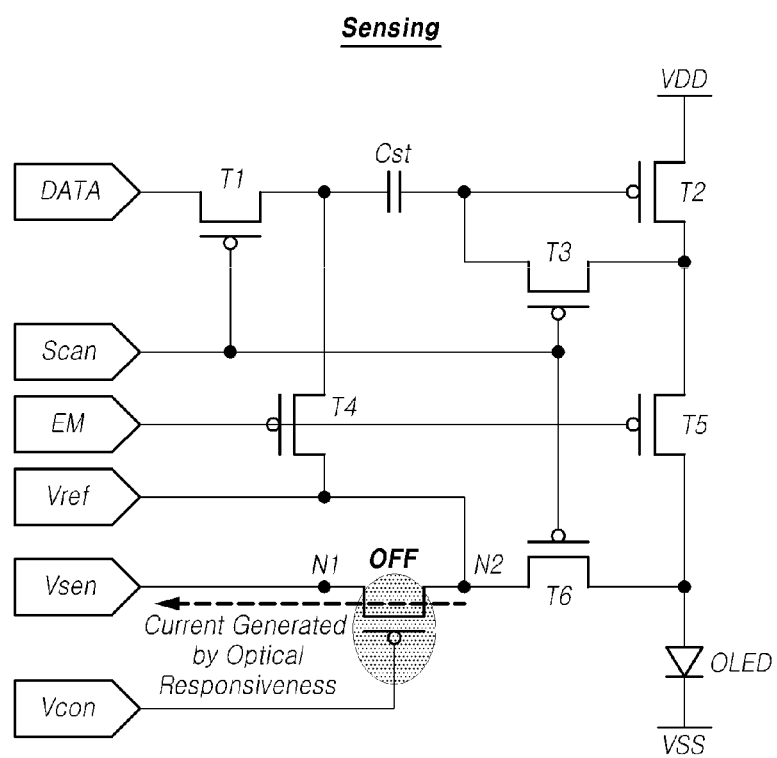
FIG. 8 illustrates another driving mode of the subpixel in the display driving period, at the points in time illustrated in FIG. 6 according to an embodiment.

FIG. 8 illustrates another driving mode of the subpixel SP in the display driving period, at the points in time illustrated in FIG. 6.

Referring to FIG. 8, a control voltage Vcon having a high level is applied to the gate electrode of the sensing transistor SST disposed in the subpixel SP in the sensing period, so that the sensing transistor SST is in a turned-off state during the sensing period.

In addition, a sensing voltage Vsen having a lower or higher voltage level than a reference voltage Vref is applied to the first node N1 of the sensing transistor SST, so that the first node N1 and the second node N2 of the sensing transistor SST have different voltages applied thereto.

Here, when the sensing transistor SST is exposed to light, an off-current can be generated due to photo-responsiveness, thereby causing a change in the current flowing through the line connected to the first node of the sensing transistor SST.

As the current generated by the sensing transistor SST responding to light is detected as described above, optical sensing can be performed using the subpixel SP disposed in the active area.

A circuit driving the sensing transistor SST can be disposed in the gate driver circuit 120 or the data driver circuit 130, or can be provided as a separate circuit.

Figure 9:
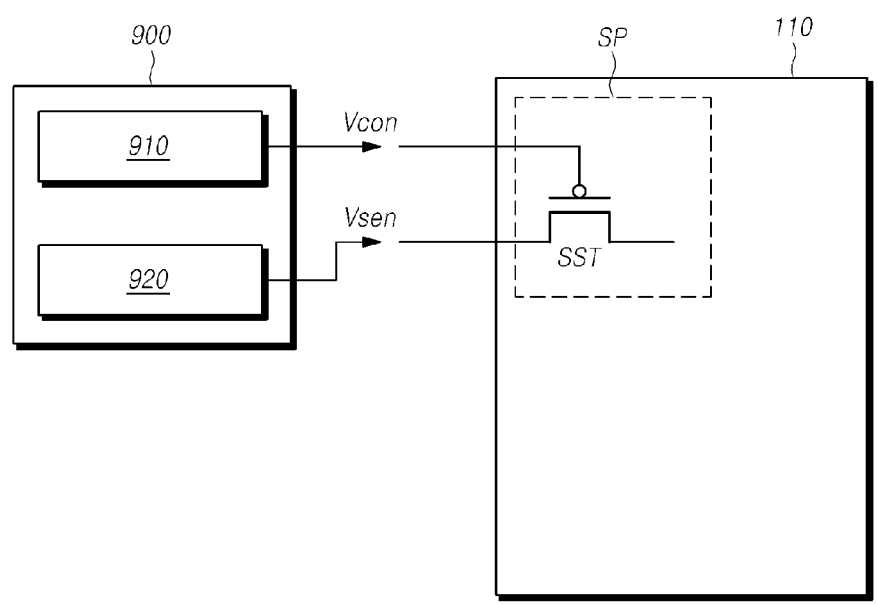
FIG. 9 illustrates a configuration of a sensing driving circuit according to embodiments.

FIG. 9 illustrates a configuration of a sensing driving circuit 900 according to embodiments.

Referring to FIG. 9, the sensing driving circuit 900 according to embodiments can include a control signal output portion 910 (such as a signal output circuit) outputting a control voltage Vcon or a control signal and a sensing portion 920 detecting a current generated as the sensing transistor SST responds to light.

The control signal output portion 910 can apply the control voltage Vcon having a turn-on level to the gate electrode of the sensing transistor SST in the display driving period, and can apply the control voltage Vcon having a turn-off level to the gate electrode of the sensing transistor SST in the sensing period.

The control signal output portion 910 can be controlled by a signal output by the controller 140. Although the control signal output portion 910 can be included in the sensing driving circuit 900 as illustrated in FIG. 9, the control signal output portion 910 can be provided within the gate driver circuit 120, separately from the sensing portion 920.

The sensing portion 920 can supply a sensing voltage Vsen to the first node N1, and can detect a change in the current of the first node of the sensing transistor SST.

In the display driving period, the sensing portion 920 supplies the sensing voltage Vsen to the first node N1 of the sensing transistor SST, the sensing voltage Vsen having the same level as a voltage applied to the second node N2.

In addition, in the sensing period, the sensing voltage Vsen having a lower or higher voltage level than a voltage applied to the second node N2 of the sensing transistor SST is applied to the first node N1 of the sensing transistor SST.

The sensing portion 920 detects a change in the current flowing through the line connected to the first node N1 of the sensing transistor SST in the sensing period, thereby allowing optical sensing to be performed by the sensing transistor SST disposed in the subpixel SP.

The sensing portion 920 can be controlled by a signal output by the controller 140. Although the sensing portion 920 can be included in the sensing driving circuit 900 as illustrated in FIG. 9, the sensing portion 920 can be provided within the data driver circuit 130, separately from the control signal output portion 910.

Figure 10:
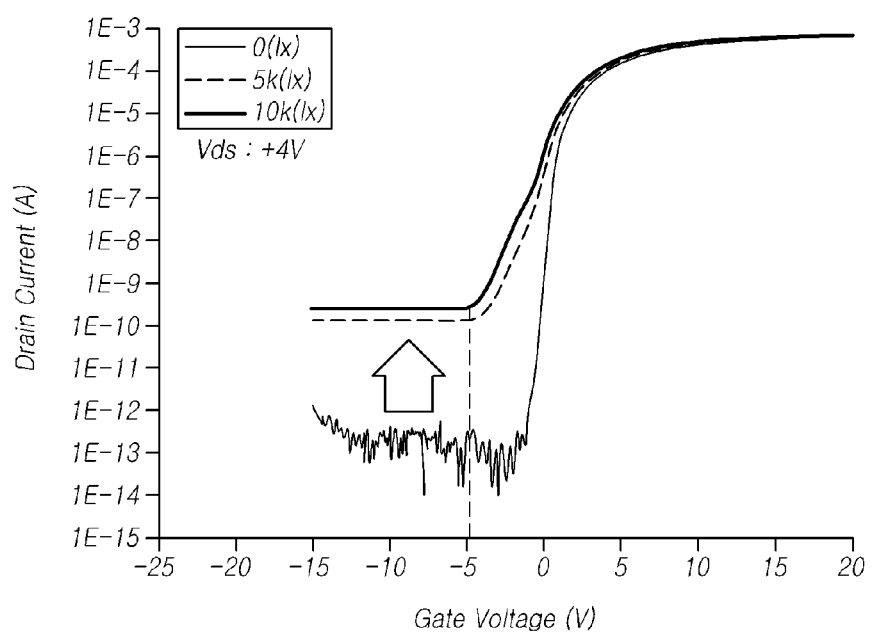
FIG. 10 illustrates measurements of an off-current in the sensing transistor according to embodiments disposed in the subpixel.

FIG. 10 illustrates measurements of an off-current in the sensing transistor SST according to embodiments disposed in the subpixel SP.

Referring to FIG. 10, the graph represents off-currents generated by light incident on the sensing transistor SST in a structure in which the active layer of the sensing transistor SST is disposed between the gate electrode of the sensing transistor SST and the light incident surface.

As described above, the graph in FIG. 10 represents off-currents generated by optical response in a situation in which the sensing transistor SST is disposed to have a bottom gate structure.

In addition, FIG. 10 illustrates results of a test in a situation in which the sensing transistor SST is an n-type transistor.

As illustrated in FIG. 10, in a situation in which a voltage lower than 0V was applied to the gate electrode of the sensing transistor SST and a voltage difference between the source electrode and the drain electrode of the sensing transistor SST was 4V, it can be appreciated that a drain current of the sensing transistor SST was increased when the sensing transistor SST is exposed to light.

That is, it can be appreciated that, when the sensing transistor SST was disposed to have a bottom gate structure and was irradiated with light, the intensity of the drain current, generated in the turned-off state of the sensing transistor SST, was increased.

Accordingly, it is possible to perform optical sensing using the sensing transistor SST disposed in the subpixel SP by increasing the off-current caused by the optical response of the sensing transistor SST.

According to embodiments, since the sensing transistor SST responding to light is disposed in the subpixel SP in the active area of the display panel 110, optical sensing can be performed in the active area of the display panel 110 (e.g., a bezel can be reduced).

In addition, the gate electrode of the sensing transistor SST disposed in the subpixel SP is located opposite to the light incident surface, and the gate electrode of the display driving transistors is located adjacent to the light incident surface. Accordingly, the photo-responsiveness of the sensing transistor SST can be improved, and the display driving transistors can be protected from any effect by external light.

In addition, the sensing transistor SST is disposed and operated in the subpixel SP so as not to affect the operation of the display driving transistors, such that high optical sensing performance can be provided while normal display driving is being performed.

The foregoing descriptions and the accompanying drawings have been presented in order to explain certain principles of the present disclosure by way of example. A person having ordinary skill in the art to which the present disclosure relates could make various modifications and variations without departing from the principle of the present disclosure. The foregoing embodiments disclosed herein shall be interpreted as being illustrative, while not being limitative, of the principle and scope of the present disclosure. It should be understood that the scope of the present disclosure shall be defined by the appended Claims and all of their equivalents fall within the scope of the present disclosure.

What is claimed is:

1. A display device comprising:
a display panel including a plurality of gate lines, a plurality of data lines and a plurality of subpixels;
at least one display driving transistor disposed in each of the plurality of subpixels;
a sensing transistor disposed in each of the plurality of subpixels;
a driver circuit configured to control the sensing transistor; and
a sensing circuit electrically connected to a first electrode of the sensing transistor,
wherein a gate electrode of the at least one display driving transistor and a gate electrode of the sensing transistor are disposed on sides opposite to each other relative to an active layer in which a first active layer of the at least one display driving transistor and a second active layer of the sensing transistor are disposed in a top-down direction, and
wherein a sensing voltage is supplied to a source electrode of the sensing transistor through a sensing voltage line and a reference voltage is supplied to a drain electrode of the sensing transistor through a reference voltage line, or the sensing voltage is supplied to the drain electrode of the sensing transistor through the sensing voltage line and the reference voltage is supplied to the source electrode of the sensing transistor through the reference voltage line.

2. The display device according to claim 1, wherein the first active layer includes a first channel of the sensing transistor and the second active layer includes a second channel of the at least one display driving transistor.

3. The display device according to claim 1, wherein the gate electrode of the at least one display driving transistor is disposed between the active layer and a surface through which external light enters, and the active layer is disposed between the gate electrode of the sensing transistor and the surface through which external light enters.

4. The display device according to claim 1, wherein the driver circuit is configured to apply a turn-on signal to the gate electrode of the sensing transistor in a display driving period, and
wherein the sensing circuit is configured to supply a sensing voltage to the first electrode of the sensing transistor, the sensing voltage having a same voltage level as a voltage applied to a second electrode of the sensing transistor in the display driving period.

5. The display device according to claim 1, wherein the driver circuit is configured to apply a turn-off signal to the gate electrode of the sensing transistor in a sensing period, and
wherein the sensing circuit is configured to supply a sensing voltage to the first electrode of the sensing transistor, the sensing voltage having a lower or higher level than a voltage applied to a second electrode of the sensing transistor in the sensing period.

6. The display device according to claim 1, wherein the sensing circuit is configured to detect a change in a current flowing through a line electrically connected to the first electrode of the sensing transistor.

7. The display device according to claim 1, wherein a surface of the active layer opposite to the gate electrode of the sensing transistor includes a rough surface, a textured surface or at least one protrusion.

8. The display device according to claim 7, wherein the active layer includes polycrystalline silicon.

9. The display device according to claim 1, wherein a second electrode of the sensing transistor is electrically connected to a source electrode or a drain electrode of the at least one display driving transistor.

10. The display device according to claim 9, wherein, in a sensing period, a voltage applied between the sensing transistor and the source or drain electrode of the at least one display driving transistor is higher than a voltage applied to the first electrode of the sensing transistor for sensing an off-current responsive to external light entering the display device.

11. The display device according to claim 1, wherein a second electrode of the sensing transistor is electrically connected to the reference voltage line or an initialization voltage line.

12. The display device according to claim 11, wherein a voltage applied to the second electrode of the sensing transistor in a display driving period and a sensing period is a voltage for initializing a voltage of an anode of a light-emitting element disposed in the subpixel.

* * * * *